(12) United States Patent
Kowalski et al.

(10) Patent No.: US 6,930,324 B2
(45) Date of Patent: Aug. 16, 2005

(54) DEVICE ARCHITECTURE AND PROCESS FOR IMPROVED VERTICAL MEMORY ARRAYS

(75) Inventors: Bernhard Kowalski, Munich (DE); Andreas Felber, Munich (DE); Valentin Rosskopf, Poettmes (DE); Till Schloesser, Dresden (DE); Juergen Lindolf, Friedberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/748,332

(22) Filed: Dec. 31, 2003

(65) Prior Publication Data

US 2004/0245569 A1 Dec. 9, 2004

(30) Foreign Application Priority Data

Dec. 31, 2002 (DE) .......................................... 102 61 457

(51) Int. Cl.[7] .............................................. H10L 23/58
(52) U.S. Cl. ......................... 257/48; 257/203; 257/207; 257/211; 257/301; 257/302; 257/328; 257/908
(58) Field of Search .......................... 257/48, 203, 207, 257/211, 301, 302, 328, 908

(56) References Cited

U.S. PATENT DOCUMENTS 5,844,915 A * 12/1998 Saitoh et al. ................ 714/719
6,388,927 B1 * 5/2002 Churchill et al. ............ 365/201
6,617,180 B1 * 9/2003 Wang ............................ 438/18
2003/0003611 A1 * 1/2003 Weiner et al. ................ 438/16

* cited by examiner

Primary Examiner—Tom Thomas
Assistant Examiner—Matthew E. Warren
(74) Attorney, Agent, or Firm—Slater & Matsil, L.L.P.

(57) ABSTRACT

An array process diagnosis test structure for an integrated circuit including a transistor array composed of vertical FET memory cell access transistors, which are formed into the depth of a substrate in the form of active webs which run parallel in the lateral direction of the circuit is disclosed. Memory cell storage capacitors in the array test structure are formed in deep trenches on the end faces of those sections of the active webs which form the vertical FET transistors. Word lines are arranged along the webs and along parallel intersecting bit lines of the array, outside of which, and on two mutually opposite edges, are located a first and second word line comb. The wordline combs are offset and connected alternately to different word lines. In addition, a first and a second bit line comb are formed on the two other opposing edges of the transistor array mutually offset and each connected to different bit lines. The test structure provides a convenient means to carry out reliability investigations on the gate oxide of the vertical FET transistors and on the capacitor dielectric in the deep trenches, capacitance measurements between the word lines, and between the word lines and other circuit layers, as well as capacitance measurements between the bit lines and between the bit lines and other circuit layers, and thus facilitates diagnosis of possible fault sources arising during the production process.

19 Claims, 4 Drawing Sheets

FIG 1 Section A-A (PRIOR ART)
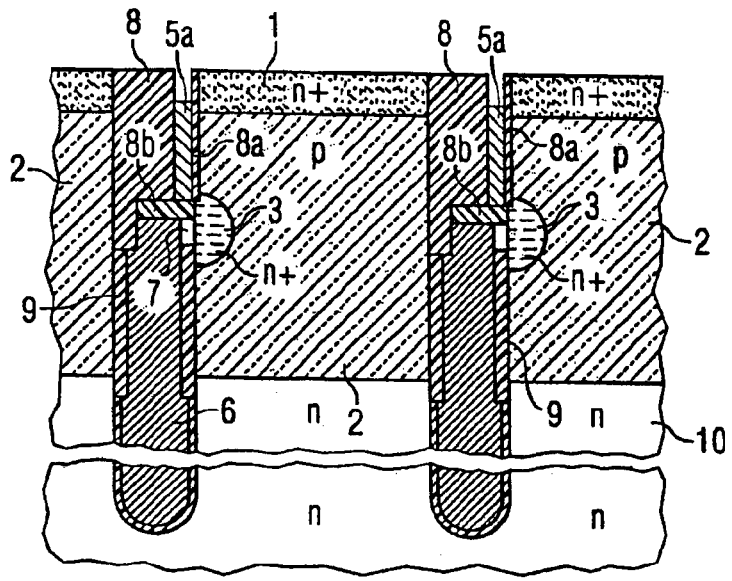
FIG 2 (PRIOR ART)
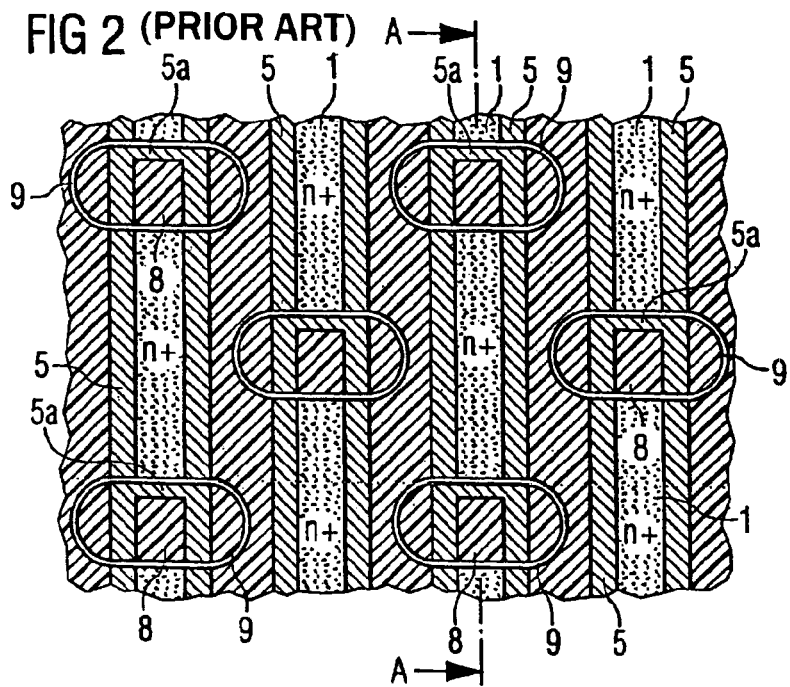
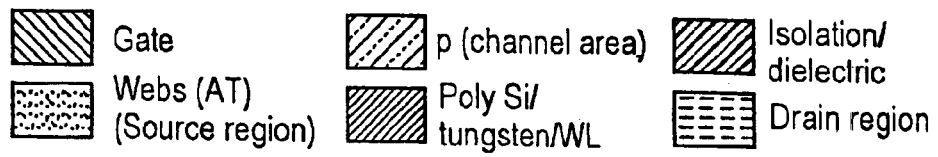

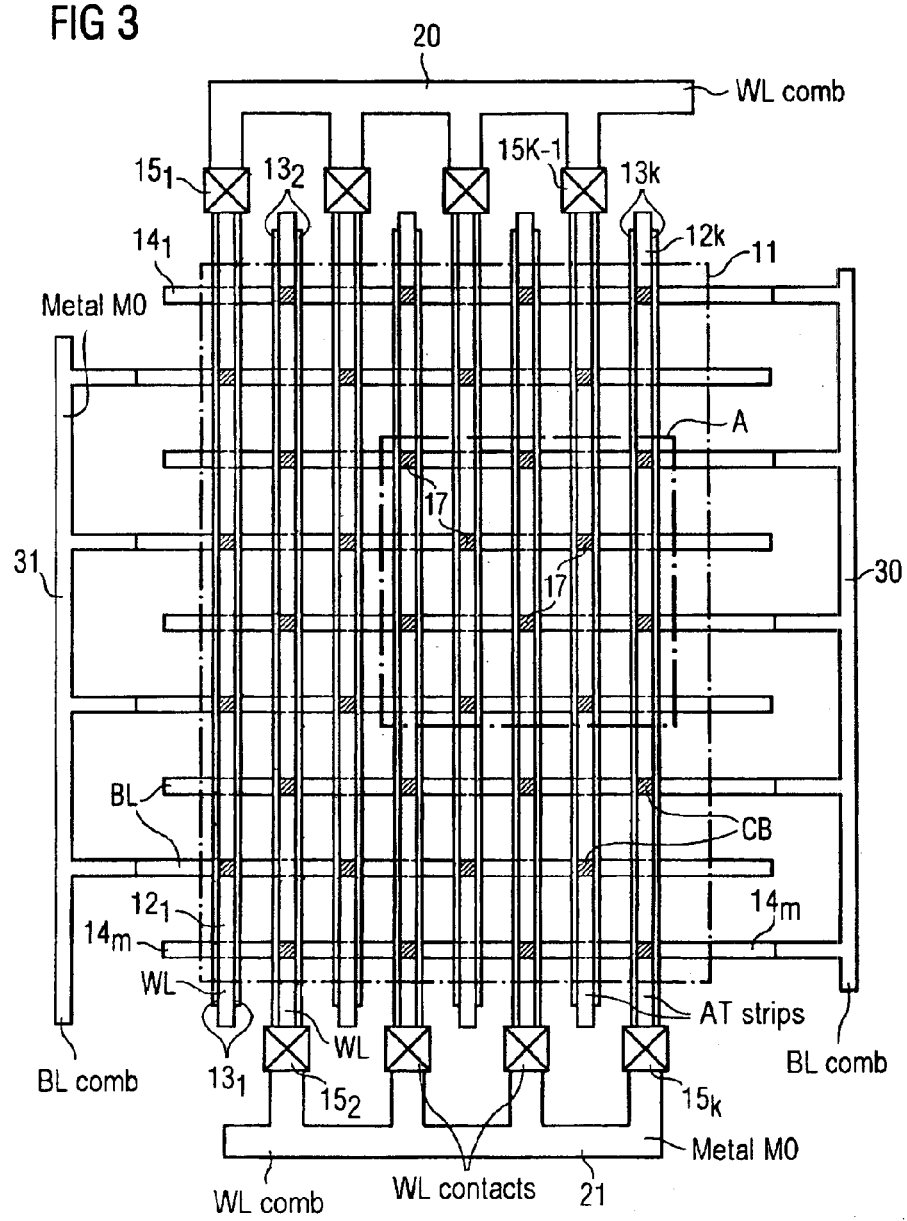

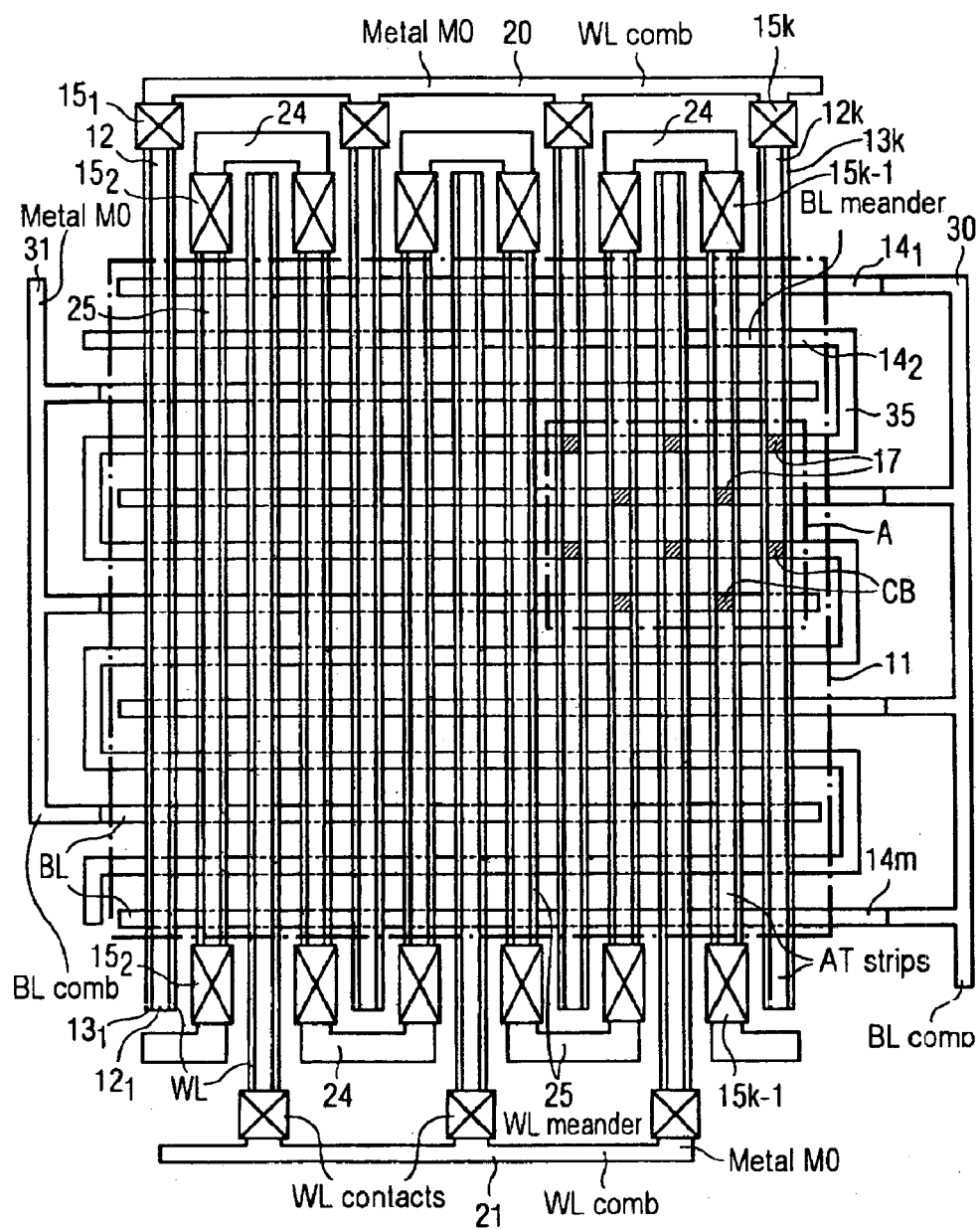

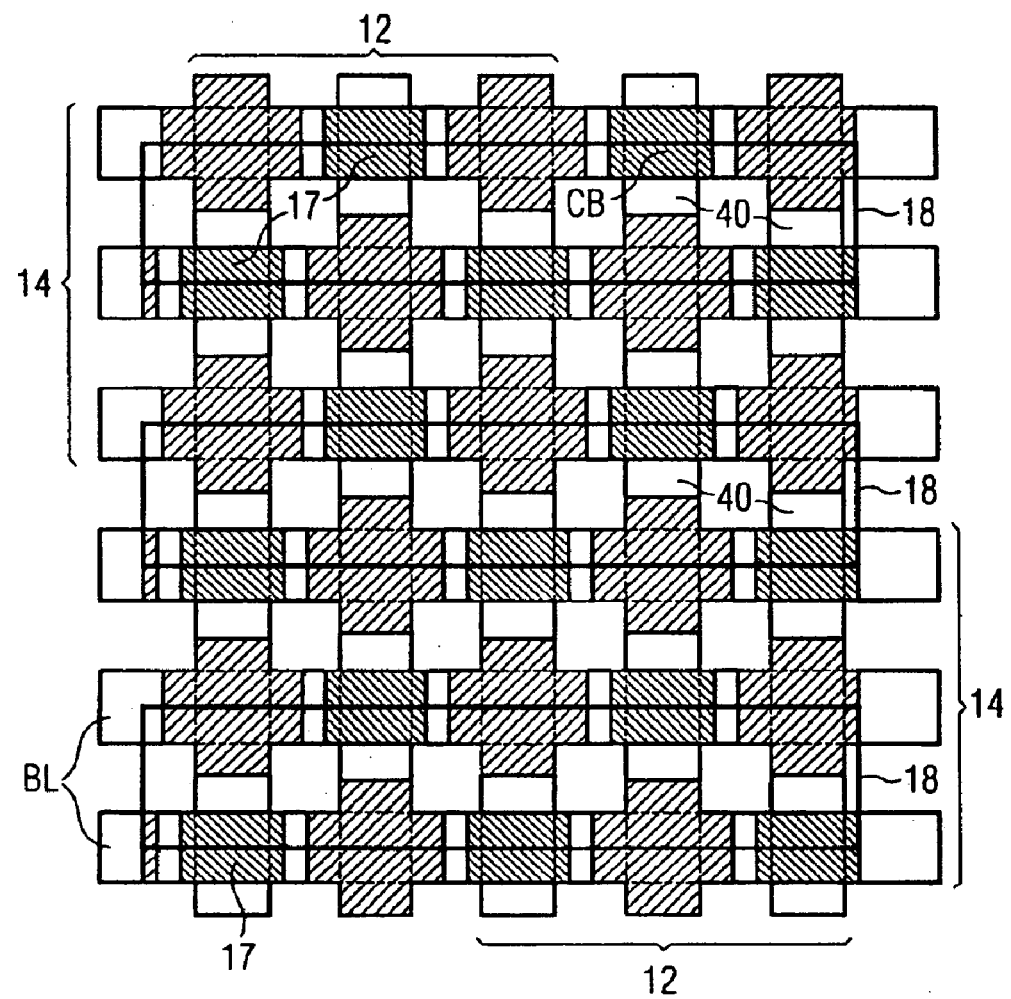
FIG 5   Detail A

US 6,930,324 B2

DEVICE ARCHITECTURE AND PROCESS FOR IMPROVED VERTICAL MEMORY ARRAYS

BACKGROUND

1. Field of the Invention

The present invention relates generally to integrated circuit architecture and more particularly to memory arrays.

2. Background of the Invention

The continuing trend of size reduction of semiconductor memory components in products such as dynamic random access memory (DRAM) has led to development of vertical trench storage capacitors and more recently, vertical access transistors. Both of these devices are associated with the basic unit of a DRAM, the memory cell. An example of a DRAM cell based on a vertical access transistor is disclosed in U.S. Pat. No. 5,519,236. Use of a vertical trench capacitor and a vertical access transistor facilitates the fabrication of a semiconductor memory cell where F=70 nm or less, while at the same time making it possible to maintain the performance of the access transistor.

In order to fabricate the above-described structures, parallel-running active webs that are filled with silicon are formed in an appropriate process, with bulk source and drain electrodes of the FET access transistors located in the webs. At each end, a web is bounded by a deep trench storage capacitor. A gate strip, which forms a gate electrode of each access transistor, is formed on the face of each active web by a vertically etched spacer, which spacer itself is used as a word line for an associated semiconductor memory cell. Gate contacts, the so-called CS (contact to the source) contacts, produce contact with a word line. Furthermore, bit lines run parallel to one another and intersect the word lines and the active webs to which they are fitted essentially at right angles.

When producing wafers for conventional transistor arrays, previously it has been known to integrate a diagnosis test structure in the wafer, which was used for checking the reliability of the access transistors, for detection of the fault density and for capacitance measurement between word lines relative to other layers, and for capacitance measurement between bit lines and relative to other layers.

In memory arrays based on vertical access transistors and vertical trenches as described above (VM), the fabrication processes and architecture are novel, and conventional diagnostic structures may not be suited for measurement of such VM arrays. It is nevertheless desirable to be able to make diagnostic measurements of VM arrays. It will therefore be appreciated that there is a need to improve the ability to measure properties of a VM DRAM.

SUMMARY

An integrated circuit containing a vertical FET access transistor array formed within a substrate in active webs which run parallel in the lateral direction of the integrated circuit is disclosed. The integrated circuit additionally includes an array of storage capacitors, wherein each storage capacitor is associated with a vertical FET access transistor and is formed in a deep trench on a face of a section of an active web which forms the vertical FET access transistor, a series of wordlines arranged along the active webs, a series of bitlines intersecting the wordlines. The integrated circuit further includes an array process diagnosis test structure connected to the wordlines, whose connection links the wordlines in a comb-like structure.

An integrated circuit for testing performance of memory devices composed of an array of memory cells which each include a vertical FET access transistor and a deep trench capacitor is also disclosed. The integrated circuit also contains a series of parallel wordlines, a series of parallel bitlines, a buried drain contact strip that connects a bitline to a memory cell, and a test structure comprise of at least one pair of comb-like structures. A first pair of comb-like structures is arranged so that one comb-like structure of the pair contacts a first series of non-adjacent wordlines on one edge of the array and the second structure contacts a second series of non-adjacent wordlines on an opposite edge to the first edge of the array. The comb-like structures are mutually offset such that no wordlines are shared between the two comb-like structures.

BRIEF DESCRIPTION OF THE DRAWINGS

FIG. 1 illustrates, schematically, a cross section through a section of a vertical transistor structure of a known transistor array into the depth of the substrate.

FIG. 2 depicts a plan view of the vertical transistor structure shown in FIG. 1.

FIG. 3 illustrates, schematically, a plan view of an integrated circuit in order to illustrate elements of an array process diagnosis test structure that is integrated therein according to an embodiment according to the present invention.

FIG. 4 illustrates, schematically, a plan view of an integrated circuit in order to illustrate elements of a further-developed array process diagnosis test structure according to another a second embodiment of the present invention.

FIG. 5 illustrates an enlarged plan view, which provides details of a relatively small area, which is annotated A, as shown in FIGS. 3 and 4.

DETAILED DESCRIPTION OF THE INVENTION

The following list of symbols is used consistently throughout the text and drawings.

List of Reference Symbols

1 Drain electrode
2 Channel zone
3 Source electrode
4 Bulk
5, 5A Gate electrode strips
6 Polysilicon column
7 Contact between the source electrode and the polysilicon column
8, 8A, 8B, 9 Isolation/dielectric
10 Substrate
11 FET transistor array
12 AT strip
13 Word lines
14 Bit lines
15 Word line contacts
17 Contacts with the bit line (CB)
18 Buried drain contact strip
20, 21 First, second word line comb
24 Metal M0
25 Word line meander
30, 31 First and second bit line comb
35 Bit line meander
40 Transistor formed by the buried drain contact strip 18

Before describing in detail embodiments of the present invention including an integrated circuit and array process diagnosis test structure integrated therein, in the following text, a known concept of a transistor array disclosed in U.S. Pat. No. 5,519,236 containing vertical FET access transistors will now be described with reference to FIGS. 1 and 2.

FIG. 1 illustrates, schematically, a cross section through the known FET transistor structure, through an active web which forms the active semiconductor areas, including two adjacent vertical FET transistors. FIG. 1 clearly indicates that a storage capacitor is formed in a trench that extends deep into a substrate 10, with the storage capacitor including capacitor electrode 6 and an insulating dielectric 9. The capacitor electrode 6 of the storage capacitor makes contact via a conductive section 7 with the drain electrode 3 of the associated vertical FET transistor. FIG. 1 also depicts insulating layers 8, 8a, and 8b, in each case between end sections 5a of circumferential gate electrode strips 5 (see FIG. 2) and a p-type area 2, which forms a channel, and the drain electrode 3, on the one hand; and the conductive capacitor electrode section 6 on the other hand. Above the p-type area 2 that forms the channel, the active web has a source area 1.

The direction of section plane A—A is indicated in FIG. 2. FIG. 2 illustrates a plan view of the structure that is depicted in FIG. 1, and illustrates the parallel arrangement of the active webs. The active webs are indicated at the top by means of the source areas 1, as well as the offset arrangement of the vertical FET selection transistors in the active parallel webs 1 on the one hand, and on the other hand the likewise offset position of the storage capacitors 6, 9, which are formed between each vertical FET transistor and are indicated by ovals 9 that are indicated by the deep trenches.

A previous patent application from the source applicant (attorney reference 12223; official file reference (Germany) 102 54 160.4) U.S. application Ser. No. 10/718,310, filed Nov. 20, 2003, which describes a novel structure of a transistor array is incorporated by reference herein in its entirety. In the aforementioned application the transistor array includes satisfactory word line contacts and word lines connected to them such that each word line contact makes contact only with an associated word line, that is to say with the gate of the vertical FET which is formed in the active web, and is isolated from other areas and elements of the transistor array and from the semiconductor memory cells. Embodiments of the present invention employ the novel transistor array structure including the word lines contacts, described in the previous patent application in more detail.

FIG. 3 depicts an exemplary embodiment of the present invention, in the form of a schematic plan view of an integrated circuit in which an array process diagnosis test structure is indicated. The reference number 11 indicates an array composed of vertical FET access transistors (not shown) which are associated with a memory cell array (not shown). Word lines (WL) $13_1$–$13_k$, which are in the form of gate electrode strips disposed on both sides of active webs $12_1$–$12_k$. Parallel bit lines $14_1$–$14_m$ run at right angles to word lines 13 and are composed of strips of the metal layers M0.

A first word line comb (WL comb) 20 is formed outside the transistor array 11 on the upper edge and makes contact with every alternate word line 13 by means of conductive sections in a metal layer (metal layer M0) and word line contacts (WL contacts) $15_1$–$15_{k-1}$. In the same way, a second word line comb 21 is provided on the lower edge, outside the transistor array 11 and offset by one word line spacing with respect to the first word line comb 20. WL comb 20 is likewise connected to the remaining word lines $13_2$–$13_k$ by means of conductor sections in the metal layer M0 and WL contacts $15_2$–$15_k$. Those ends of the word lines 13 which are not connected by means of the first and second WL combs 20 and 21 hang in the air, that is to say, they remain unconnected there.

The first and second WL combs 20 and 21 which are offset with respect to one another and are in this way connected to every other word line provide for the capacitance to be measured between WL combs 20 and 21 as well as between the WL combs and other layers or structures in the integrated circuit arrangement.

The bit lines 14, which run at right angles to word lines 13, are formed by conductor strips in the metal layer M0. In a similar way to that for the two WL combs 20 and 21, a first and a second bit line comb (BL comb) 30 and 31 are provided to the right and left of the outer edges of transistor array 11, such that the BL combs are offset with respect to one another and each BL comb 30 and 31 connects to every other bit line 14 to one another. Contact is likewise made between the BL combs 30 and 31 and the respective bit lines 14 that are connected to them via conductor sections in the metal layer M0. BL combs 30 and 31 firstly provide for capacitance to be measured between the BL combs 30 and 31 and for measurement of the capacitance of the BL combs to other structures in the integrated circuit. In conjunction with WL combs 20 and 21, capacitance measurement between bit lines 14 and word lines 13 can also be performed. In FIG. 3, a dashed-dotted line which is denoted A surrounds a section of the transistor array 11 in which contacts 17 (so-called CB contacts) relating to the respective bit line are indicated, whose structure and function is explained below with reference to FIG. 5.

The schematic plan view in FIG. 4 depicts an integrated circuit according to another embodiment of the present invention, including a further-developed array process diagnosis test structure. Features of the test structure include, in addition to capacitance measurements between word lines and bit lines and to other circuit structures, diagnosis of the gate oxide, for example the detection of short circuits that occur as a result of the gate oxide being destroyed, as well as inadvertent discontinuities. In addition, reliability tests, in particular gate oxide reliability and dielectric reliability of the storage capacitors, and diagnosis of the fundamental suitability of the basic new process, by detection of a fault density, can be tested in accordance with the structure depicted in FIG. 4.

According to FIG. 4, a word line meander 25 is also incorporated within an upper and a lower word line comb 20, 21, which are arranged offset with respect to one another and are each connected to different word lines (WL) 13. Word line meander 25 connects in series with one another word lines which are not connected to one another by means of the two word line combs 20 and 21. U-shaped sections 24 of the metal layer M0 are connected to the respective word lines 13 by means of word line contacts $15_2$–$15_{k-1}$ at the top and bottom, in order to form the word line meander 25.

FIG. 4 illustrates that the first (upper) WL comb 20 connects the first, fifth, ninth, thirteenth, . . . etc. word lines 13 to one another, that the second (lower) word line comb 21 connects the third, seventh, eleventh, . . . etc. word lines 13 to one another, and that the word line meander 25 connects the second, fourth, sixth, eighth, tenth, twelfth, . . . etc. word lines in series. All of these connections start from a word line 13 and pass via a word line contact 15, a section of the metal layer M0 and a further word line contact 15 to a further word line 13.

Furthermore, a bit line meander 35 is provided interleaved with BL combs 30 and 31. The first BL comb 30 connects the first, fifth, ninth and thirteen bit lines 14 in series, and the second BL comb 31 connects the third, seventh, eleventh, etc. bit lines 14 in series, while the bit line meander 35 connects the second, fourth, sixth, eighth, tenth, twelfth, . . . bit lines 14 in series.

As in FIG. 3, FIG. 4 likewise depicts a detail section annotated A, which contains contacts to the bit line (so-called CB contacts) 17, whose configuration and function will be described in the following text with reference to FIG. 5. The other sections of the transistor array 11 may also, of course, contain such CB contacts 17, although, for the sake of simplicity, these are not shown in FIG. 4.

Section A of the transistor array 11, which is illustrated in the form of a schematic plan view in FIG. 5, has a number of parallel active webs 12 (word lines are not shown here), and bit lines 14 which intersect the webs 12 at right angles. Buried contacts strips 18 are provided in the direction of the bit lines 14, forming drain contacts and in each case overlapping, for example, two adjacent bit lines 14. The buried drain contact strip 18 is used to produce a connection to the active web 12 during the process, at each location of the storage capacitors which are formed in the deep trenches and at which it is desirable for the semiconductor memory cells (not shown in FIG. 5) to make contact firstly with a vertical FET and secondly with a CB contact 17 to the bit line. The buried drain contact strip 18 is formed wherever the layout areas of the deep trench and of the active web 12 intersect. In a most preferred embodiment of the present invention, the buried drain contact strip 18 is formed using a line mask aligned at right angles to the word lines. The buried contact strip 18 in conjunction with the active web 12 and the source electrode s located at the top on the active web 12, plus the word line as a gate form a transistor for which the buried contact strip 18 is a mask. This transistor must be open in order, for example, to make it possible to test the reliability of the thin gate oxide. Areas 40 in FIG. 5 indicates two such transistors, which are produced with the aid of two buried strips 18, which are located alongside one another.

In a preferred embodiment of the present invention, an integrated circuit including an array process diagnosis test structure is located on the semiconductor wafer, for example between the chips that are to be produced. By way of example, one such integrated circuit arrangement may be provided for each six chips.

One embodiment of the present invention involves an array process diagnosis test structure which allows access to an FET access transistor of a VM array, and allows checking and diagnosis of the reliability, in particular the reliability of the gate oxide and of the storage capacitor dielectric which are formed in the deep trenches. Preferably the array process diagnosis test structure includes structures that make it possible to determine the fundamental feasibility of the new processes on which the VM array is based, including structures for determination of the fault density, capacitance measurement between word lines and capacitance between a word line and other layers in the integrated circuit, as well as capacitance measurement between bit lines and between the latter relative to the other layers of the integrated circuit. In an exemplary embodiment, the word lines of the VM array exist only at the sides of the straight active webs and cannot form complex shapes such as a U or L, because complex shapes such as these are not feasible for the webs.

In an exemplary embodiment of the present invention, an integrated circuit has an array process diagnosis test structure which is integrated in the wafer containing the integrated circuit. Preferably, the process diagnosis test structure includes capability for capacitance measurement; defect detection; reliability investigations on the gate oxide of the vertical FET access transistors; and reliability measurement of the deep trench storage capacitor dielectric. Preferably, the array process diagnosis test structure includes a first and a second word line comb which are arranged opposite one another and laterally offset with respect to one another for parallel connection to alternate word lines, in which each comb connects a set of alternate wordlines, one comb located on a first outer face of the transistor array, and the other comb located on the opposite face of the array. In the above manner the combs provide a means to connect every n-th word line from the two sides of the array. The respectively opposite ends of the word lines are not connected. At the end where a set of alternating wordlines are coupled together in the form of word line comb connecting the third, seventh, eleventh, . . . etc. bit lines to one another, and the bit line meander connecting the second, fourth, sixth, eighth, . . . etc. bit lines to one another in series.

In an exemplary embodiment, a buried drain contact strip is used to make a first contact between a storage capacitor, which is located in the deep trench, and the vertical FET transistor associated with the memory cell of the storage capacitor, and a second contact from the storage capacitor to the associated memory—bit line. The buried drain contact strip is formed where the layout areas of the deep trench and the active web intersect. In a preferred embodiment, the simplest and best solution to form the buried drain contact strip employs a line mask at right angles to the word lines. The buried drain contact strip is used as a mask at the respective location of the semiconductor memory cells which have to make contact with the word line and bit line combs and meanders, in order to produce a transistor to make contact with the active web. The drain contact strip, in conjunction with the active web and the source electrode on the vertical transistor at the top on the active web, plus the word line acting as a gate thus form the transistor, which must be opened in order to make it possible to test the reliability of the vertical transistors in the transistor array, and to test the dielectric of the storage capacitance.

The features of the integrated circuit arrangement as described above result in an array process diagnosis monitoring and word line/bit line capacitance measurement structure for a transistor array which is associated with a semiconductor memory cell array and is composed of vertical FET access transistors, which integrated circuit arrangement allows in particular monitoring and testing of the reliability, of the gate oxide of the vertical FETs and of the reliability of the dielectric of the storage capacitors in the deep trenches, thus making it possible to indicate the fundamental suitability of the basic new process by detection of a fault density and, furthermore, making it possible to measure the capacitances between the word lines and relative to other layers in the integrated circuit arrangement, as well as the capacitances between the bit lines and relative to other layers in the integrated circuit arrangement.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. An integrated circuit comprising:
   a vertical FET access transistor array formed into the depth of a substrate in active webs which run parallel in the lateral direction of the integrated circuit and are implemented as vertical trenches;
   an array of storage capacitors, wherein each storage capacitor is associated with a vertical FET access transistor and is formed in a deep trench on a face of a section of an active web which forms the vertical FET access transistor;
   a series of wordlines arranged along the active webs;
   a series of bitlines intersecting the wordlines; and
   an array process diagnosis test structure, wherein the process diagnosis test structure is connected to the wordlines and wherein the connection to the wordlines forms a wordline comb structure, wherein the comb structure comprises:
      a first wordline comb connected by a series of contacts to a first series of non-adjacent wordlines along a first edge of the transistor array, wherein the spacing between each successive wordline in the first series of non-adjacent wordlines is defined by a parameter n; and
      a second wordline comb connected by a series of contacts to a second series of non-adjacent wordlines along a second edge of the transistor array opposite to the first edge, wherein the spacing between each successive wordline in the second series of non-adjacent wordlines is defined by the parameter n, and wherein the first series and second series of wordlines are offset such that no wordlines are common to both the first and second series.

2. The integrated circuit of claim 1, wherein the value of n is equal to 2.

3. The integrated circuit of claim 1, wherein value of n is equal to 4,
   wherein the mutual offset between the first and second wordline combs is two wordlines,
   further comprising a wordline meander, wherein, by means of a series of contacts, the wordline meander connects in series all of the wordlines that lie between the wordlines that are connected to the fist and second wordline combs, such that the wordline meander is isolated from the first and second wordline combs.

4. The integrated circuit of claim 3, wherein the U-shaped section resides in an M0 metal plane level.

5. The integrated circuit of claim 1, wherein each contact in the first series of contacts to the first series of wordlines is connected to an area of the active web associated with the respective word line, but is isolated from other elements in the integrated circuit, and wherein each contact is connected to the comb structure by means of a section of a metal plane.

6. The integrated circuit of claim 5, wherein the section of a metal plane resides in an M0 metal level.

7. The integrated circuit of claim 5, wherein the value of m is equal to 2.

8. The integrated circuit of claim 1, further comprising a bitline comb, wherein the bitline comb structure comprises:
   a first bitline comb connected to a first series of non-adjacent bitlines along a third edge of the transistor array, wherein the spacing between each successive bitline in the first series of non-adjacent bitlines is defined by a parameter m;
   a second bitline comb connected to a second series of non-adjacent bitlines along a fourth edge of the transistor array opposite to the third edge, wherein the spacing between each successive bitline in the fourth series of non-adjacent bitlines is defined by the parameter m, and wherein the first series and second series of bitlines are offset to include no common bitlines.

9. The integrated circuit of claim 8, wherein the value of n is equal to 2, and wherein the value of m is equal to 2.

10. The integrated circuit of claim 9, wherein each pair of successive wordlines in the wordline meander are linked by a U-shaped section of a metal plane connected to each contact of the pair of successive wordlines.

11. The integrated circuit of claim 8, wherein value of n is equal to 4,
    wherein the mutual offset between the first and second wordline combs is two wordlines, further comprising a wordline meander,
    wherein, by means of a series of contacts, the wordline meander connects in series all of the wordlines that lie between the wordlines connected to the first and second wordline combs, such that the wordline meander is isolated from the first and second wordline combs.

12. The integrated circuit of claim 8, wherein value of in is equal to 4,
    wherein the mutual offset between the first and second bitline combs is two bitlines,
    further comprising a bitline meander, wherein the bitline meander connects in series all of the bitlines that lie between the bitlines connected to the first and second bitline, combs such that the bitline meander is isolated from the first and second bitline combs.

13. The integrated circuit of claim 12, wherein the bitline meander comprises a section of metal formed in an M0 metal level.

14. The integrated circuit of claim 8, further comprising a buried drain contact strip formed in a desired region of the transistor array and arranged parallel to the direction of the bit lines, wherein the buried drain contact strip is formed where the layout areas of a deep trench and an active web intersect,
    whereby the buried contact strip establishes a contact between a storage capacitor formed in a deep trench, and an associated vertical FET transistor,
    and whereby contact between semiconductor memory cells in the desired region and an associated bit line is made.

15. An integrated circuit for testing performance of memory devices comprising: an array of memory cells wherein each cell includes a vertical FET access transistor and a deep trench capacitor associated with the access transistor; a series of parallel wordlines for contacting the access transistor gates; a series of parallel bitlines; a buried drain contact strip for connecting a bitline to a memory cell; and a test structure comprising a plurality of comb-like structures, wherein each of a first pair of comb-like structures link a series of regularly spaced non-adjacent wordlines together, wherein the pair of comb-like structures connect to wordlines of the array at opposite edges, and wherein the comb-like structures are mutually offset such that no wordlines are shared between the two comb-like structures.

16. The integrated circuit of claim 15, wherein plurality of comb-like structures further comprises a second pair of comb-like structures linking a series of regularly spaced bitlines together, wherein the pair of combo-like structures connect to bitlines of the array at opposite edges, and wherein the comb-like structures are mutually offset such that no bitlines are shared between the two comb-like structures.

17. An integrated circuit comprising:
   a vertical FET access transistor array formed into the depth of a substrate in active webs which run parallel in the lateral direction of the integrated circuit and are implemented as vertical trenches;
   an array of storage capacitors, wherein each storage capacitor is associated with a vertical FET access transistor and is formed in a deep trench on a face of a section of an active web which forms the vertical FET access transistor;
   a series of wordlines arranged along the active webs;
   a series of bitlines intersecting the wordlines;
   an array process diagnosis test structure, wherein the process diagnosis test structure is connected to the wordlines and wherein the connection to the wordlines farms a wordline comb structure, wherein the process diagnosis test structure is connected to the bitlines and wherein the connection to the bitlines forms a bitline comb structure; and
   a buried drain contact strip formed in a desired region of the transistor array and arranged parallel to the direction of the bit lines, wherein the buried drain contact strip is formed where the layout areas of a deep trench and an active web intersect;
   whereby the buried contact strip establishes a contact between a storage capacitor formed in a deep trench, and an associated vertical FET transistor, and whereby contact between semiconductor memory cells in the desired region and an associated bit line is made.

18. The integrated circuit of claim 17, wherein the bitline comb structure comprises:
   a first bitline comb connected to a first series of non-adjacent bitlines along a third edge of the transistor array, wherein the spacing between each successive bitline in the first series of non-adjacent bitlines is defined by a parameter m; and
   a second bitline comb connected to a second series of non-adjacent bitlines along a fourth edge of the transistor array opposite to the third edge, wherein the spacing between each successive bitline in the fourth series of non-adjacent bitlines is defined by the parameter m, and wherein the first series and second series of bitlines are offset to include no common bitlines.

19. The integrated circuit of claim 18, wherein the value of m is equal to 2.

* * * * *

UNITED STATES PATENT AND TRADEMARK OFFICE
CERTIFICATE OF CORRECTION

PATENT NO. : 6,930,324 B2
DATED : August 16, 2005
INVENTOR(S) : Kowalski et al.

It is certified that error appears in the above-identified patent and that said Letters Patent is hereby corrected as shown below:

<u>Column 8,</u>
Line 35, delete "in" insert -- m --.

<u>Column 9,</u>
Line 11, delete "combo-like" insert -- comb-like --.
Line 32, delete "farms" insert -- forms --.

Signed and Sealed this

Twenty-ninth Day of November, 2005

JON W. DUDAS
*Director of the United States Patent and Trademark Office*